(12) United States Patent
Abraham et al.

(10) Patent No.: US 6,711,466 B2
(45) Date of Patent: Mar. 23, 2004

(54) METHOD AND SYSTEM FOR MAINTAINING A DESIRED DISTANCE BETWEEN A DISPENSER AND A SURFACE

(75) Inventors: David W. Abraham, Croton, NY (US); Richard A. John, Yorktown Heights, NY (US); Robert J. von Gutfeld, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 10/042,917

(22) Filed: Jan. 7, 2002

(65) Prior Publication Data

US 2003/0130760 A1 Jul. 10, 2003

(51) Int. Cl.[7] .......................... G06F 17/00; B05C 11/00
(52) U.S. Cl. ........................ 700/240; 700/231; 118/712
(58) Field of Search ................................ 700/213, 231, 700/240; 118/323, 410, 415, 668, 712

(56) References Cited

U.S. PATENT DOCUMENTS

| | | | | |
|---|---|---|---|---|
| 3,809,308 A | * | 5/1974 | Roeder et al. ................. 228/9 |
| 4,298,784 A | * | 11/1981 | Schmall .................. 219/124.02 |
| 4,762,578 A | * | 8/1988 | Burgin et al. ................ 118/712 |
| 5,110,615 A | * | 5/1992 | Maiorca et al. ................. 427/8 |
| 5,913,455 A | * | 6/1999 | La et al. ......................... 222/55 |
| 6,093,251 A | * | 7/2000 | Carr et al. ................... 118/323 |

* cited by examiner

Primary Examiner—Gene O. Crawford
(74) Attorney, Agent, or Firm—Fleit, Kain, Gibbons, Gutman, Bongini & Bianco, P.L.; Jon A. Gibbons

(57) ABSTRACT

A system and method for maintaining a dispensing system a desired distance between a dispenser and a surface is shown. The system includes a light-emitting device, connected to the dispenser, that emits light in the direction of the surface. The emitted light is reflected off of the surface as well as a mirror connected to the dispenser. Subsequently, all reflected light is received by a sensor. Using the sensor data, a computer calculates the distance between the dispenser and the surface. A servo device then adjusts the location of the dispenser, in accordance with the calculated distance, in order to maintain the desired distance between the dispenser and the surface. One advantage of the system and method is the increased ability to maintain a desired distance between the dispenser and the surface. This can lead to increased and higher quality production by a dispensing system.

18 Claims, 9 Drawing Sheets

METHOD AND SYSTEM FOR MAINTAINING A DESIRED DISTANCE BETWEEN A DISPENSER AND A SURFACE

CROSS-REFERENCE TO RELATED APPLICATIONS

Not applicable.

BACKGROUND OF THE INVENTION

1. Field of the Invention

The present invention relates to the field of dispensing systems. More specifically, the present invention relates to the field of systems for dispensing viscous fluids onto a substrate.

2. Description of Related Art

Dispensing systems are used in the manufacture of a variety of articles including electronics, motherboards, microprocessors and liquid crystal displays. Typically, a dispensing system consists of a stationary surface, a dispenser for dispensing a substance onto the surface, and a servo mechanism for controlling the movement of the dispenser. The surface generally contains a substrate that acts to receive the substance that is deposited by the dispenser. The dispenser can deposit a variety of substances including viscous materials such as glue or an elastomer. The dispenser is moved over the substrate by a servo device as the dispenser deposits a substance onto the substrate. The substance deposited on the substrate can later be cured by thermal means.

In the manufacture of certain products, such as a liquid crystal display, it is necessary to fasten together two substrates usually with a glue sealant in conjunction with a substance such as an elastomer. In addition, it is necessary for the two substrates to maintain a particular distance constantly between them. The distance between the two substrates is dictated by the thickness of the substance, usually the glue sealant and the spacer balls, sealing the two substrates. When using a dispenser to deposit a viscous material, the height at which the dispenser deposits the substance onto the substrate can affect the thickness of the substance on the substrate. Thus, when a dispenser is used to deposit a substance for sealing together two substrates that must be kept at a particular distance from each other, it is necessary that the dispenser is kept at a particular height over the surface as the dispenser moves over it. This is a difficult task as the distance between the dispenser and the substrate is typically very small—on the order of microns. Also, inadvertent movements of the surface beneath the dispenser can add an additional obstacle in maintaining a constant distance between the dispenser and the substrate. In addition, the movement of the dispenser by the servo device can add an additional obstacle in maintaining a constant distance.

Accordingly, what is needed is a method and system that effectively maintains the dispenser at a desired distance from the surface.

SUMMARY OF THE INVENTION

Briefly, in accordance with the present invention, disclosed is a system and method for maintaining a dispensing system a desired distance between a dispenser and a surface. In an embodiment of the present invention, the system includes a light-emitting device, connected to the dispenser, that emits light in the direction of the surface. The emitted light is reflected off of the surface as well as a mirror connected to the dispenser. Subsequently, all reflected light is received by a sensor. Using the sensor data and measuring interference fringes, a computer calculates the distance between the dispenser and the surface. A servo device then adjusts the location of the dispenser, in accordance with the calculated distance, in order to maintain the desired distance between the dispenser and the surface.

In another embodiment of the present invention, the system includes a first conductive element attached to the dispenser and a second conductive element attached to the surface. A voltage is applied to both conductive elements, which form a capacitor. Then, a sensor or bridge circuit measures the capacitance between the two conductive elements. Using the sensor data, a computer calculates the distance between the dispenser and the surface. A servo device then adjusts the location of the dispenser, in accordance with the calculated distance, in order to maintain the desired distance between the dispenser and the surface.

In another embodiment of the present invention, the system includes a spring attached to the dispenser. The spring is made to contact the surface, which produces a restoring force within the spring. Then, a sensor measures the restoring force of the spring. Using the sensor data, a computer calculates the distance between the dispenser and the surface. A servo device then adjusts the location of the dispenser, in accordance with the calculated distance, in order to maintain the desired distance between the dispenser and the surface. In another embodiment of the present invention, the system includes a spring and a light-emitting device, both of which are attached to the dispenser. The spring is made to contact the surface, which produces a restoring force within the spring. The light-emitting device emits light that is reflected off of the spring. A sensor receives the light reflected off of the spring. Using the sensor data, a computer calculates the distance between the dispenser and the surface. A servo device then adjusts the location of the dispenser, in accordance with the calculated distance, in order to maintain the desired distance between the dispenser and the surface.

One advantage of the present invention is the increased ability to quickly and efficiently detect and modify the distance between the dispenser and the surface. This allows a dispenser to maintain a desired distance between the dispenser and the surface. This can lead to the production of a higher quality product by a dispensing system. This can also lead to increased production by a dispensing system.

The foregoing and other features and advantages of the present invention will be apparent from the following more particular description of the preferred embodiments of the invention, as illustrated in the accompanying drawings.

BRIEF DESCRIPTION OF THE DRAWINGS

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE PREFERRED EMBODIMENT

Overview of the System

The present invention is described in terms of the examples below. This is for convenience only and is not intended to limit the application of the present invention. In fact, after reading the following description, it will be apparent to one skilled in the relevant art(s) how to implement the following invention in alternative embodiments.

Figure 1:
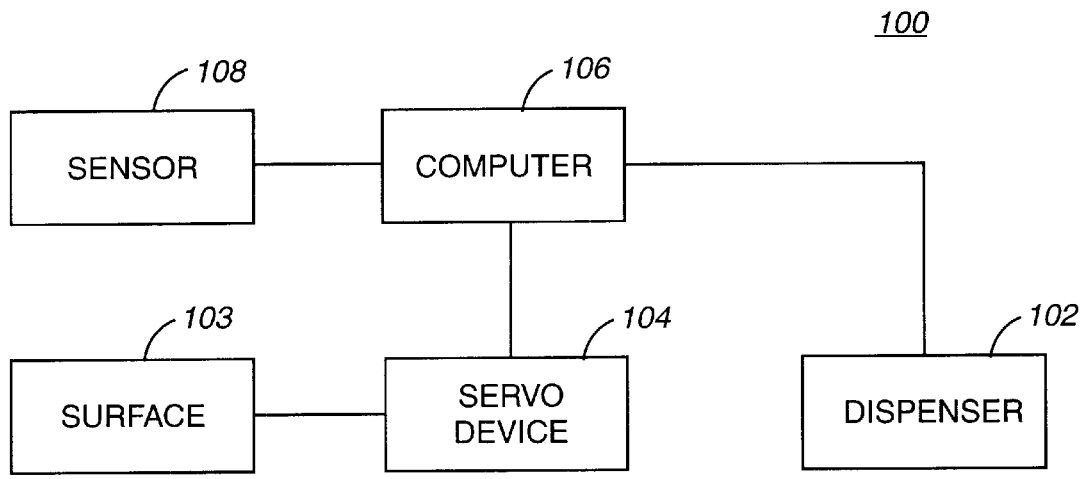
FIG. 1 is a block diagram illustrating the physical architecture of a dispensing system, according to an embodiment of the present invention, showing connectivity among the various components.

FIG. 1 is a block diagram illustrating the physical architecture of a dispensing system 100, according to an embodiment of the present invention, showing connectivity among the various components. FIG. 1 is a generalized embodiment of the present invention.

FIG. 1 includes a dispenser 102, a stationary surface 103, a servo device 104, a computer 106 and a sensor 108. Dispensing system 100 can be any dispensing system known to one of ordinary skill in the art. Such a dispensing system can be used to manufacture a variety of goods including electronics, motherboards, microprocessors and liquid crystal displays. Dispensing system 100 can dispense onto surface 103 any viscous materials known to one of ordinary skill in the art to be dispensed by a dispensing system, such as elastomers, glue, epoxy and epoxy acrylate. In addition, such a dispensing system can be used to dispense substances onto a substrate located on surface 103. Such a substrate can be the housing for a liquid crystal display or a conducting wafer for a microprocessor.

Typically, surface 103 remains stationary while dispenser 102 moves along a predetermined path over surface 103. In another embodiment, surface 103 is moved while dispenser 102 is stationary. As dispenser 102 moves over surface 103, dispenser 102 dispenses a substance (typically from a nozzle) and deposits the substance onto surface 103. As described above, dispenser 102 is normally maintained at a desired distance from surface 103 as dispenser 102 dispenses the substance. In an embodiment of the present invention, the desired distance between dispenser 102 and surface 103 is one hundred microns or less.

Servo device 108 mechanically controls the movement of dispenser 102. Servo device 108 can be any mechanical device known to one of ordinary skill in the art for moving a dispenser. Servo device 108 moves dispenser 102 in directions parallel to surface 103 as well as towards and away from surface 103.

In an embodiment of the present invention, servo device 108 can be a robotic arm connected to dispenser 102. In this embodiment, the robotic arm extends to move dispenser 102 in directions parallel to surface 103 as well as towards and away from surface 103.

Computer 106 controls the way in which servo device 108 moves dispenser 102. Computer 106 issues instructions to servo device 108 regarding the movement of dispenser 102. As such, computer 106 maintains a communications path with servo device 108. Computer 106 also controls the way in which dispenser 102 dispenses the substance onto surface 103. Computer 106 issues instructions to dispenser 102 regarding the dispensing of the substance onto surface 103. As such, computer 106 maintains a communications path with dispenser 102. Computer 106 can be any computer processing system that can be used to control a dispensing system. Computer 106 is described in greater detail below.

Sensor 108 collects information associated with the distance between dispenser 102 and surface 103. Sensor 108 can be any sensor known to one of ordinary skill in the art for sensing the distance between a dispenser and a surface. Examples of sensor 108 include a light emitter, a tension measuring device and a volt meter. Particular embodiments of sensor 108 are described in greater detail below. Information collected by sensor 108 is used by computer 106 for calculation. As such, computer 106 maintains a communications path with sensor 108.

Figure 7:
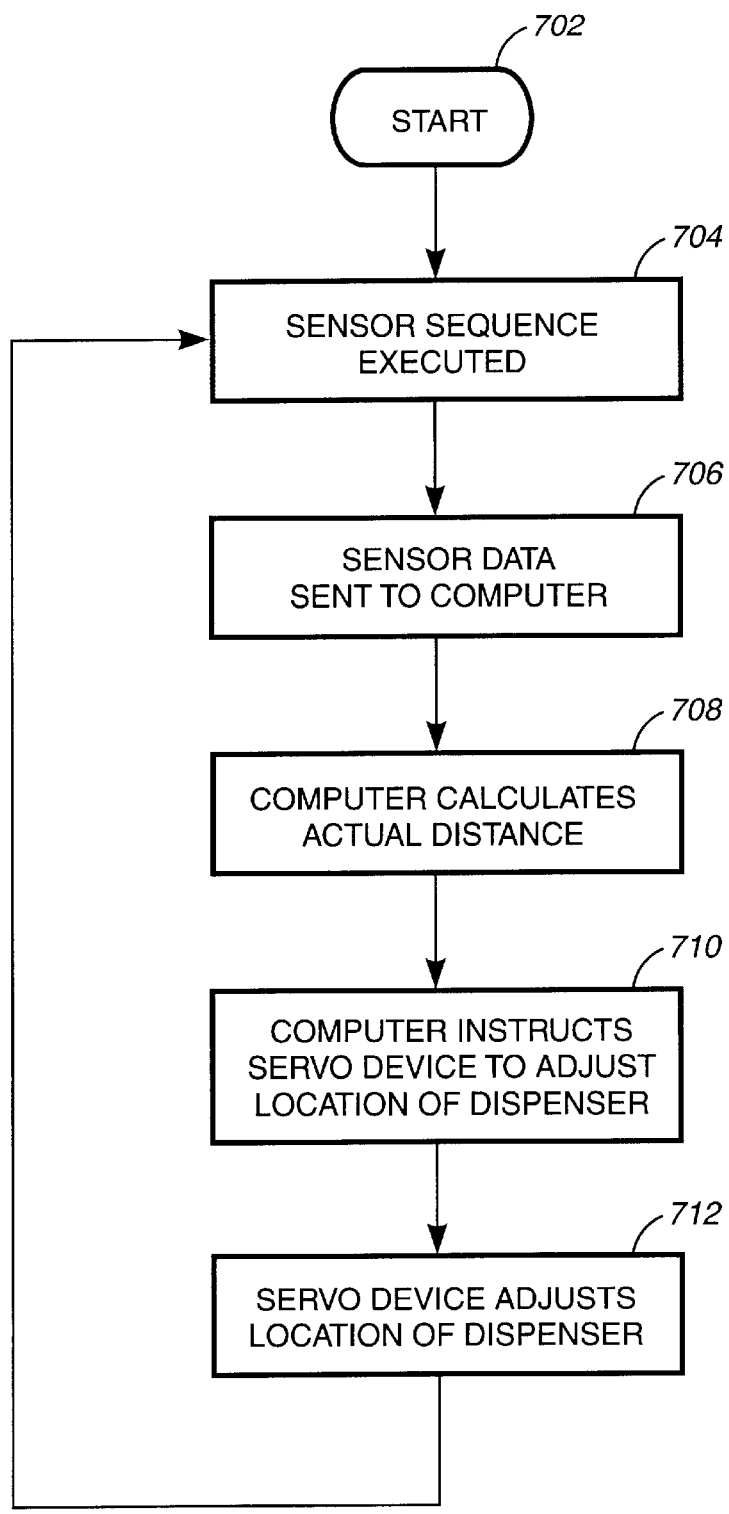
FIG. 7 is a flow chart depicting an embodiment of the operation and control flow of the dispenser movement process of the present invention.

The operation of FIG. 1 is shown in FIG. 7.

Figure 2:
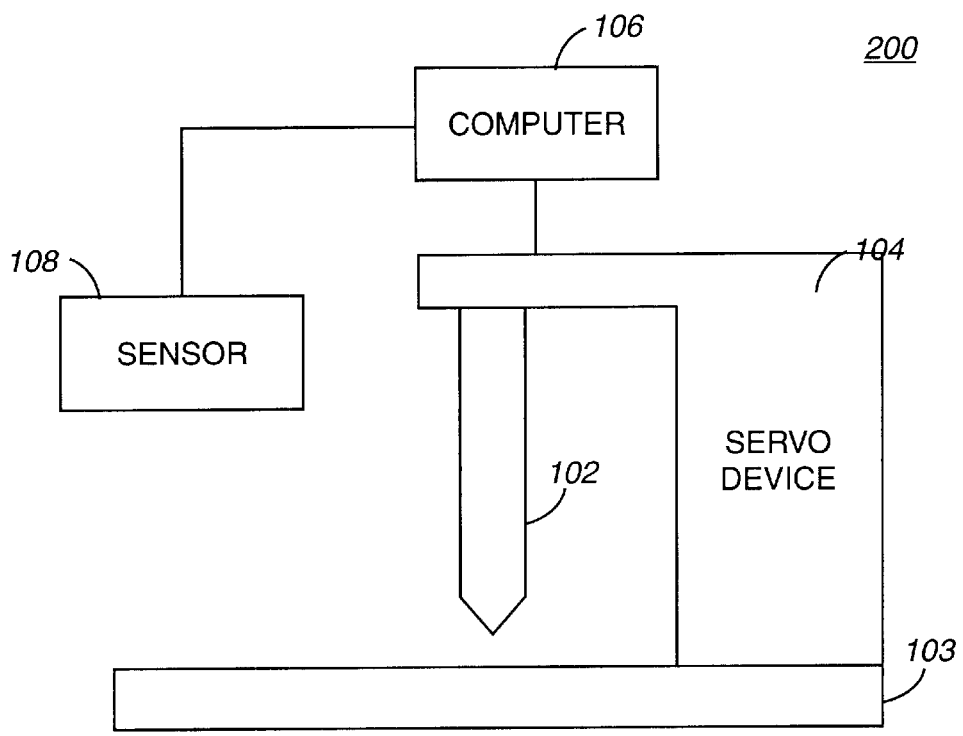
FIG. 2 is an illustration showing the physical architecture of a dispensing system, according to an embodiment of the present invention, showing connectivity among the various components.

FIG. 2 is an illustration showing the physical architecture of a dispensing system 200, according to an embodiment of the present invention, showing connectivity among the various components. FIG. 2 shows the components shown in FIG. 1 as well as the arrangement of the components in relation to each other.

FIG. 2 shows surface 103 located at the base of system 200. Dispenser 102 is located above surface 103 such that dispenser 102 can dispense a substance onto surface 103 as dispenser 102 moves over surface 103. Servo device 104 is connected to dispenser 102 such that servo device 104 can control the movement of dispenser 102 as it moves over surface 103.

Computer 106 is connected to servo device 104 such that computer 106 is able to instruct servo device 104 on its movement of dispenser 102. Computer 106 can be connected to dispenser 102 via any communications path known to one of ordinary skill in the art. Likewise, computer 106 is connected to sensor 108 such that computer 106 is able to receive information collected by sensor 108. Computer 106 can be connected to sensor 108 via any communications path known to one of ordinary skill in the art.

Sensor 108 is located above surface 103 and is used to measure the distance between dispenser 102 and surface 103. Sensor 108 is used by system 200 in maintaining a constant height between dispenser 102 and surface 103. Sensor 103 is positioned to the side, or in front, of dispenser 102 such that sensor 108 measures a distance at a location above surface 103 before dispenser 102 arrives at that location. Thus, sensor 108 "looks ahead" to a future location such that system 200 has an opportunity to adjust the distance between dispenser 102 and surface 103 before dispenser 102 arrives at that location.

The operation of FIG. 2 is shown in FIG. 7.

FIG. 7 is a flow chart depicting an embodiment of the operation and control flow 700 of the dispenser movement process of the present invention. FIG. 7 generally shows the operation of systems 100 and 200. Control flow 700 begins with step 702 and flows directly to step 704.

In step 704, the sensor sequence is executed. The sensor sequence consists of a process by which sensor data, pertaining to the distance between dispenser 102 and surface 103, is gathered by sensor 108. Step 704, and its alternative embodiments, is described in greater detail below.

In step 706, the sensor data gathered in step 704 above is sent to computer 106.

In step 708, computer 106 calculates the distance between dispenser 102 and surface 103, according to the sensor data received in step 706 above and the current speed of dispenser 102 over surface 103.

In step 710, computer 106 instructs servo device 104 to adjust the location of dispenser 102 according to the actual distance calculated in step 708 above. Thus, if the actual distance calculated above is less than the desired distance between dispenser 102 and surface 103, then computer 106 instructs servo device 104 to move dispenser 102 away from surface 103. Likewise, if the actual distance calculated above is greater than the desired distance between dispenser 102 and surface 103, then computer 106 instructs servo device 104 to move dispenser 102 towards surface 103. The purpose of the instruction from computer 106 to servo device 104 is to achieve the desired distance between dispenser 102 and surface 103. In an embodiment of the present invention, the location of dispenser 102 is adjusted to within at least 20% of the desired distance.

In step 712, servo device 104 adjusts the location of dispenser 102 in accordance with the instructions from computer 106, as given in step 7120 above. Control flow may then flow back to step 704. Thus, steps 704 to 712 may be reiterated periodically or at will by system 100 as the system operates. Subsequently, control flows back to step 704. In this fashion, sensor 108 and computer 106 continuously monitor and adjust the distance between dispenser 102 and surface 103.

First Embodiment: Measuring Distance Through Capacitance

Figure 3:
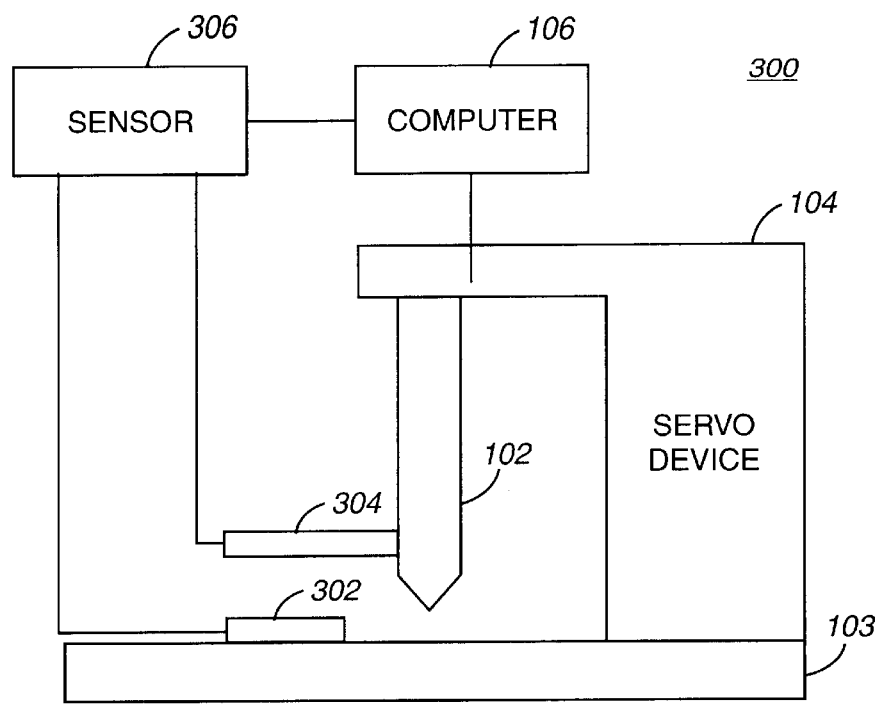
FIG. 3 is an illustration showing the physical architecture of a dispensing system, including a technique for measuring the distance between the dispenser and the surface using a capacitance measurement of a capacitor, according to an embodiment of the present invention, showing connectivity among the various components.

FIG. 3 is an illustration showing the physical architecture of a dispensing system 300, including a scheme for measuring the distance between the dispenser and the surface using a capacitance measurement of a capacitor, according to an embodiment of the present invention, showing connectivity among the various components.

FIG. 3 shows a first conductive element 304 connected to dispenser 102 and a second conductive element 302 connected to surface 103. In an embodiment of the present invention, the first and second conductive elements 304, 302 can be any conductive substance capable of holding an electrical charge. Examples of such a conductive substance include a thin, metallic plate or a thin, metallic strip. In one embodiment of the present invention, portions of the substrate deposited on surface 103 are used in the capacitor.

FIG. 3 also shows sensor 306, which is connected to the first and second conductive elements 304, 302. Sensor 306 is connected to the first and second conductive elements 304, 302 via a conductive cable or other conduit such as a copper wire cable. Sensor 306 is capable of applying a voltage to both conductive elements, thus making it possible to create a measurable capacitance between the first and second conductive elements 304, 302. The capacitance can be on the order of one picofarad. Sensor 306 is also capable of measuring the capacitance between the first and second conductive elements 304, 302. Therefore, sensor 306 can include a volt meter, amp meter, bridge circuit or other device for measuring capacitance, which will vary with the distance between the first and second conductive elements 304, 302.

The capacitance across the first and second conductive elements 304, 302 is related to the distance between the two elements. This is because capacitance can be calculated approximately as: $C=(E_0*A)/d$, where C is capacitance, $E_0$ is a constant value relating to the permativity of the air between the two elements and d is the distance between the two elements. Therefore, the distance between the two capacitor elements is inversely related to the capacitance across the two elements. Thus, the capacitance is related to the distance between dispenser 102 and surface 103. More generally, the capacitance decreases as the spacing between the first and second conductive elements 304, 302 increases.

Figure 8:
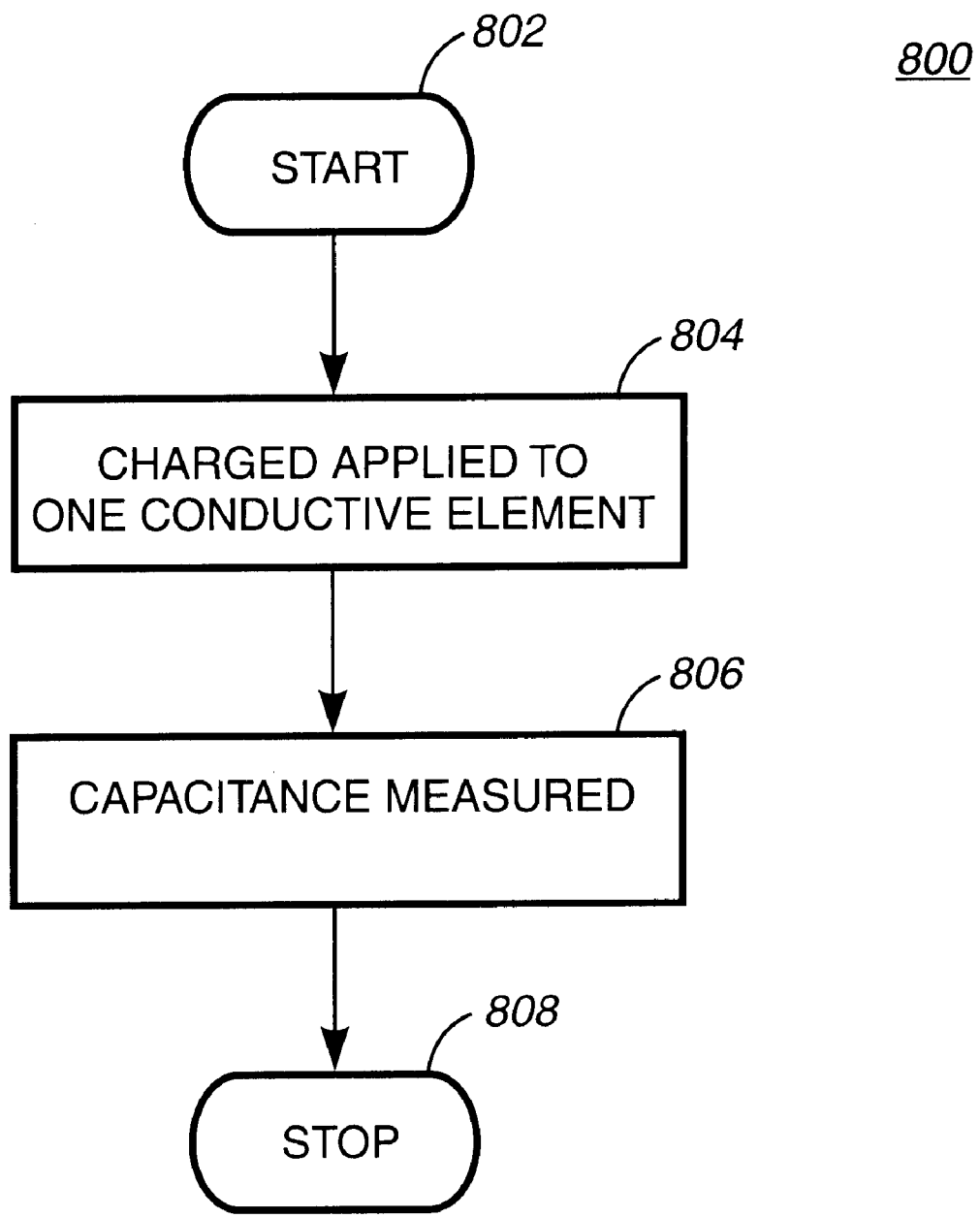
FIG. 8 is a flow chart depicting an embodiment of the operation and control flow of the capacitance measurement process of the present invention.

The operation of FIG. 3 is shown in FIG. 7 above, with additional details regarding the sensor sequence shown in FIG. 8.

FIG. 8 is a flow chart depicting an embodiment of the operation and control flow 800 of the capacitance measurement process of the present invention. FIG. 8 shows the execution of the sensor sequence of step 704, as it applies to system 300. Control flow 800 begins with step 802 and flows directly to step 804.

In step 804, sensor 306 applies a voltage to both conductive elements 304, 302. This induces a capacitance current across the first and second conductive elements 304, 302.

In step 806, the capacitance across the first and second conductive elements 304, 302 is measured.

In step 808, control flow 800 ceases.

The capacitance measurement is subsequently used by computer 106 in step 708.

Second Embodiment: Measuring Distance Through Light Reflection

Figure 4:
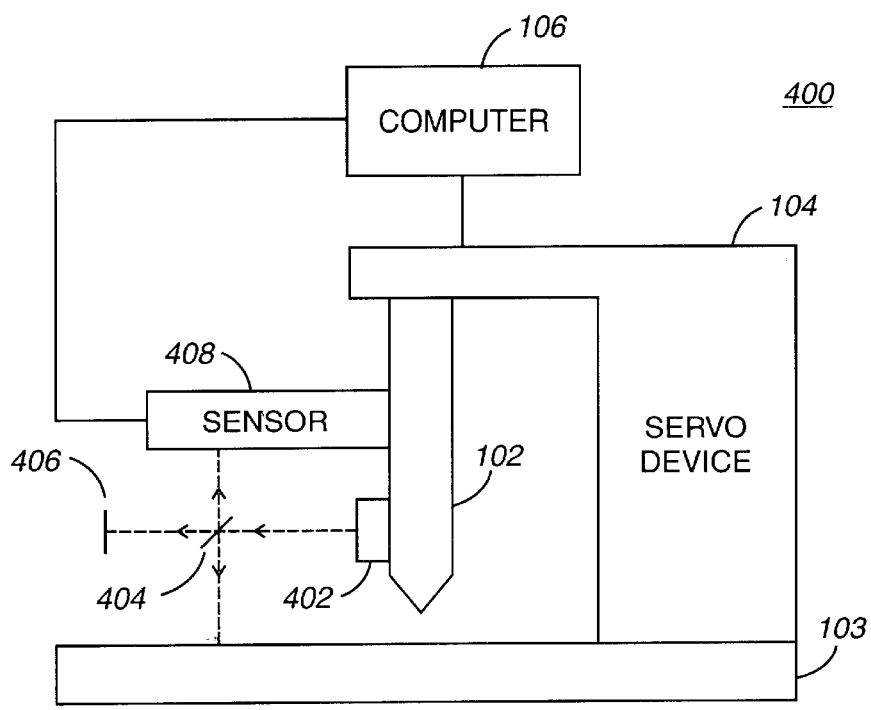
FIG. 4 is an illustration showing the physical architecture of a dispensing system, including a scheme for measuring the distance between the dispenser and the surface using light reflected off of the surface and a mirror attached to the dispenser, according to an embodiment of the present invention, showing connectivity among the various components.

FIG. 4 is an illustration showing the physical architecture of a dispensing system 400, including a scheme for measuring the distance between the dispenser and the surface using light reflected off of the surface and a mirror attached to the dispenser, according to an embodiment of the present invention, showing connectivity among the various components.

FIG. 4 shows a light emitter 402, a beam splitter 404, a mirror 406 and a sensor 408. Light emitter 402, beam splitter 404, mirror 406 and sensor 408 are all connected to dispenser 102 and all move with dispenser 102 as it moves over surface 103. Surface 103, of course, remains stationary as dispenser 102 moves over it.

Light emitter 402 can be a photodiode, a fiber optic cable including a light source, or any other means known to one of ordinary skill in the art for emitting light. Beam splitter 404 is a mirror with reflective capabilities. Mirror 406 is a fully reflective mirror. Sensor 408 can be a photo-detector, a quad-cell, a bi-cell or any other means known to one of ordinary skill in the art for detecting light. Sensor 408 acts as an interferometer—this is described in greater detail below.

Light emitter 402 emits light in the direction of beam splitter 404 and mirror 406. As the light emitted by light emitter 402 enters beam splitter 404, the light is separated into two groups: a first group and a second group. The first group penetrates beam splitter 404. The first group then continues to travel towards mirror 406. Upon reflection by mirror 406, the first group returns to beam splitter 404 and it is reflected by beam splitter 404 towards sensor 408. Sensor 408 receives the reflected light and collects pertinent data.

The second group of light is reflected by beam splitter 404 and continues to travel downwards towards surface 103.

Upon reflection by surface 103, the second group then returns to beam splitter 404, it penetrates beam splitter 404 and continues to travel towards sensor 408. Sensor 408 receives the reflected light and collects pertinent data.

The data received by sensor 408 can be used to calculate the distance between dispenser 102 and surface 103. This is because the light of the first group traveled a different path than the light of the second group. The light of the first group came in contact only with objects that are connected to dispenser 102 and move with dispenser 102—beam splitter 404 and mirror 406. However, the light of the second group came in contact with surface 103, which can vary in distance from dispenser 102. The distance between dispenser 102 and surface 103 can be calculated by sensor 408 using a technique called fringe counting, known to one of ordinary skill in the art.

Fringe counting involves the reception of two groups of light. The interferometric properties of sensor 408 allow the sensor to receive and process both groups of light. Both groups of light are observed together and the interference pattern produced by both groups of light are viewed. The produced interference pattern, similar to a Moiré pattern, includes fringes. Characteristics associated with the produced interference pattern, such as the number of fringes produced, are associated with the difference in the distance traveled by both groups of light. Thus, the interference pattern produced by both groups of light are examined and the difference in distance traveled by both groups of light is calculated.

Figure 9:
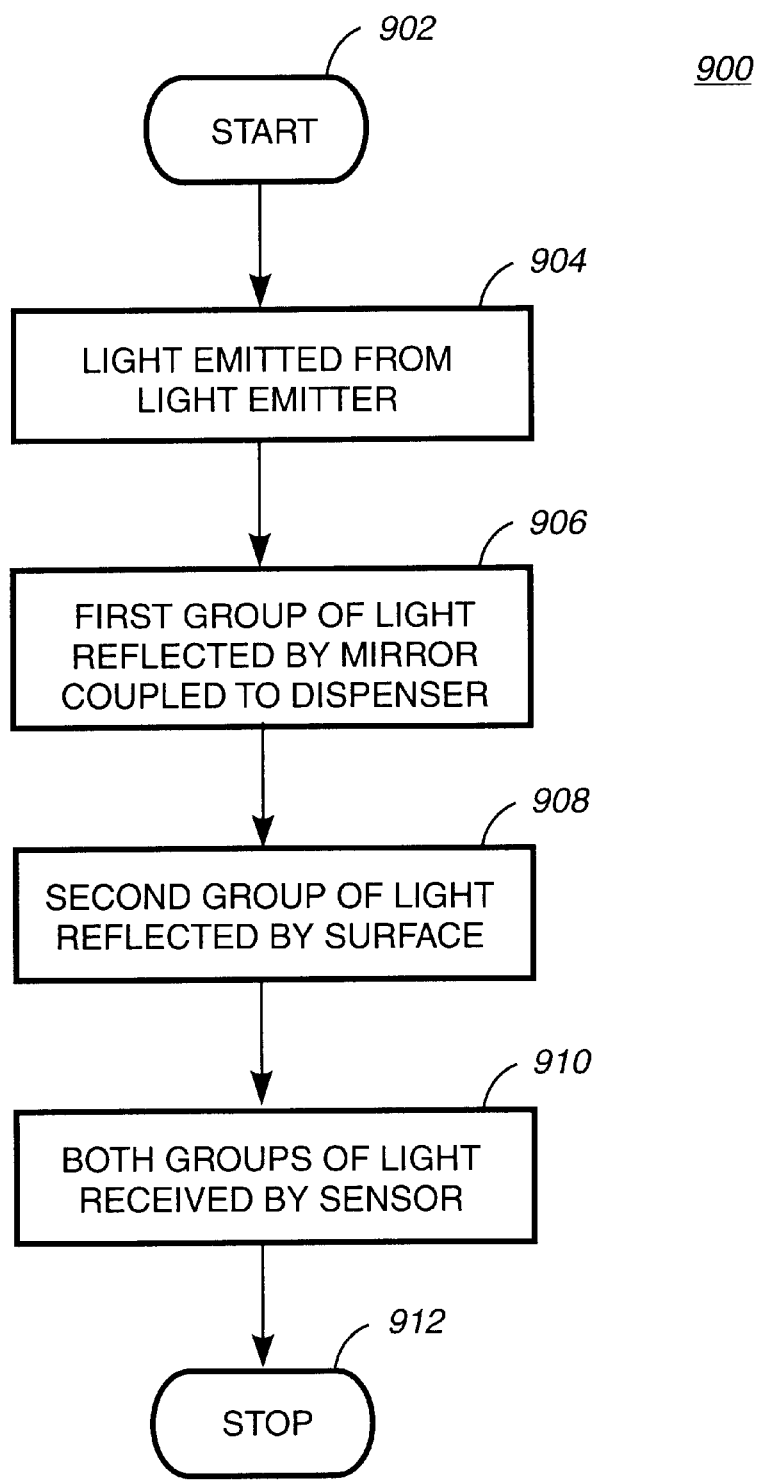
FIG. 9 is a flow chart depicting an embodiment of the operation and control flow of the first light emission and reception process of the present invention.

The operation of FIG. 4 is shown in FIG. 7 above, with additional details regarding the sensor sequence shown in FIG. 9.

FIG. 9 is a flow chart depicting an embodiment of the operation and control flow 900 of the first light emission and reception process of the present invention. FIG. 9 shows the execution of the sensor sequence of step 704, as it applies to system 400. Control flow 900 begins with step 902 and flows directly to step 904.

In step 904, light is emitted from light emitter 402. This light enters beam splitter 404, which separates the light into two groups (as explained above).

In step 906, the first group of light is reflected off of mirror 404, which is attached to dispenser 102, and subsequently towards sensor 408.

In step 908, the second group of light is reflected off of surface 103, which can vary in distance from dispenser 102, and subsequently towards sensor 408.

In step 910, sensor 408 receives both groups of light and collects pertinent data.

In step 912, control flow 900 ceases.

The data collected by sensor 408 is subsequently used by computer 106 in step 708 to calculate the actual distance between dispenser 102 and surface 103.

Third Embodiment: Measuring Distance Through Spring Tension

Figure 5:
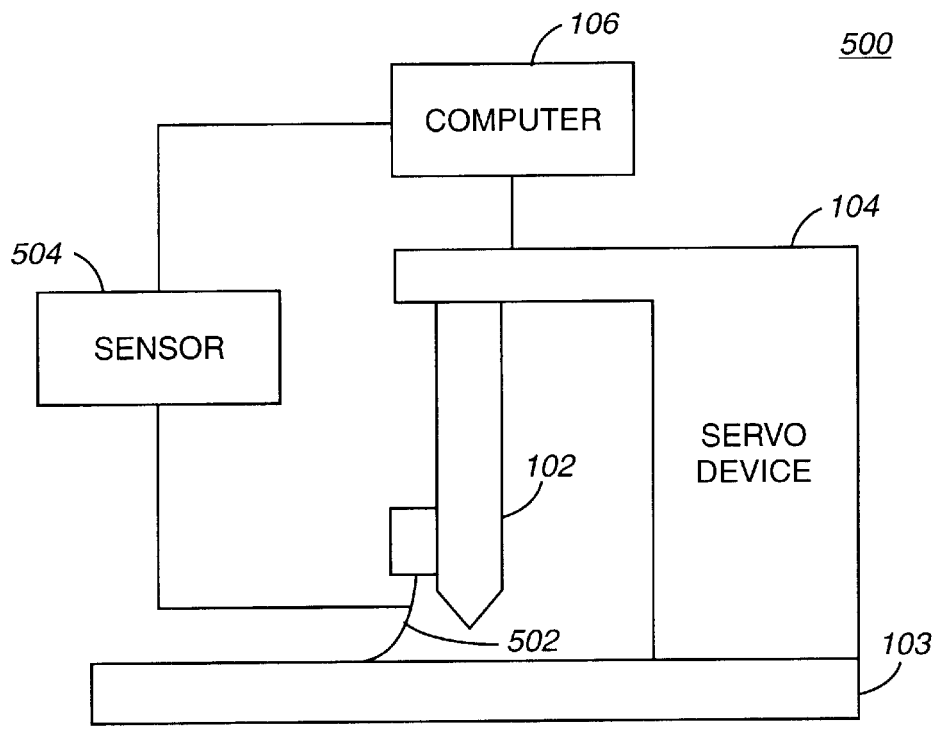
FIG. 5 is an illustration showing the physical architecture of a dispensing system, including a scheme for measuring the distance between the dispenser and the surface using a restoring force measurement of a spring, according to an embodiment of the present invention, showing connectivity among the various components.

FIG. 5 is an illustration showing the physical architecture of a dispensing system 500, including a scheme for measuring the distance between the dispenser and the surface using a restoring force measurement of a spring, according to an embodiment of the present invention, showing connectivity among the various components.

FIG. 5 shows a spring 502 attached to dispenser 102. Spring 502 can be a leaf spring or any other spring that may be used for this purpose, known to one of ordinary skill in the art. As shown, spring 502 extends towards surface 103. At rest, or equilibrium, there is no net restoring force of spring 502. As spring 502 is placed in contact with surface 103 and spring 502 is moved further towards surface 103, a net restoring force is produced within spring 502. That is, as spring 502 is displaced, a net restoring force is produced. The contour of spring 502 changes as the restoring force of spring 502 is increased. As shown in FIG. 5, spring 503 bends at a greater angle as the restoring force of spring 502 is increased.

FIG. 5 also shows sensor 504, which can measure the restoring force of spring 502. Sensor 504 can accomplish this task in a variety of ways. In one embodiment, sensor 504 measures the restoring force of spring 502 as it pushes against surface 103. The restoring force of a spring is associated with the displacement of the spring from equilibrium. As the restoring force of a spring increases, so does the amount of displacement of the spring. This is because Hooke's Law shows that: F=K*x, where F is the restoring force of a spring after it has been displaced, K is a constant value relating to the stiffness of the spring and x is the distance the spring has been displaced. Therefore, the distance a spring has been displaced is proportional to the net restoring force of the spring. Thus, a measurement of the restoring force of spring 502 can be used to measure the distance between dispenser 102 and surface 103.

In another embodiment, sensor 504 can measure the angle at which spring 502 is bent. The angle at which a leaf spring is bent is associated with the amount of displacement of the spring from equilibrium. As the amount of displacement of a leaf spring increases, so does the angle at which the spring is bent. Thus, a measurement of the angle at which spring 502 is bent can be used to measure the distance between dispenser 102 and surface 103.

Figure 10:
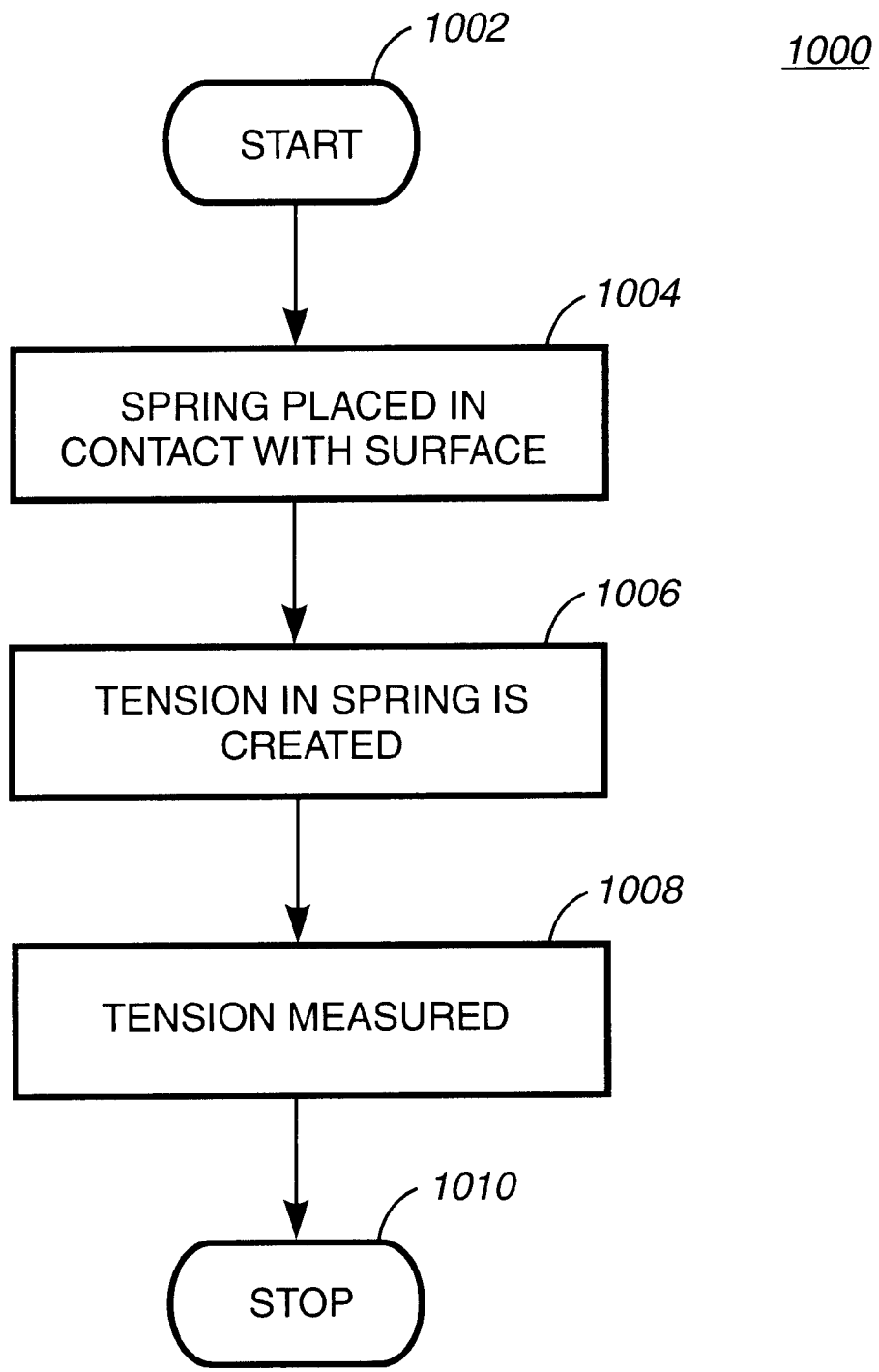
FIG. 10 is a flow chart depicting an embodiment of the operation and control flow of the tension measurement process of the present invention.

The operation of FIG. 5 is shown in FIG. 7 above, with additional details regarding the sensor sequence shown in FIG. 10.

FIG. 10 is a flow chart depicting an embodiment of the operation and control flow 1000 of the tension measurement process of the present invention. FIG. 10 shows the execution of the sensor sequence of step 704, as it applies to system 500. Control flow begins with step 1002, with control flowing directly to step 1004.

In step 1004, spring 502 is placed in contact with surface 103.

In step 1006, tension is created within spring 502 as a result of its contact with surface 103.

In step 1008, the tension within spring 502 is measured by sensor 504.

In step 1010, control flow 1000 ceases.

The data collected by sensor 504 is subsequently used by computer 106 in step 708 to calculate the actual distance between dispenser 102 and surface 103.

Fourth Embodiment: Measuring Distance Through Spring Tension and Light Reflection FIG. 6 is an illustration showing the physical architecture of a dispensing system 600, including a scheme for measuring the distance between the dispenser and the surface using light reflected off of a spring, according to an embodiment of the present invention, showing connectivity among the various components.

Figure 6:
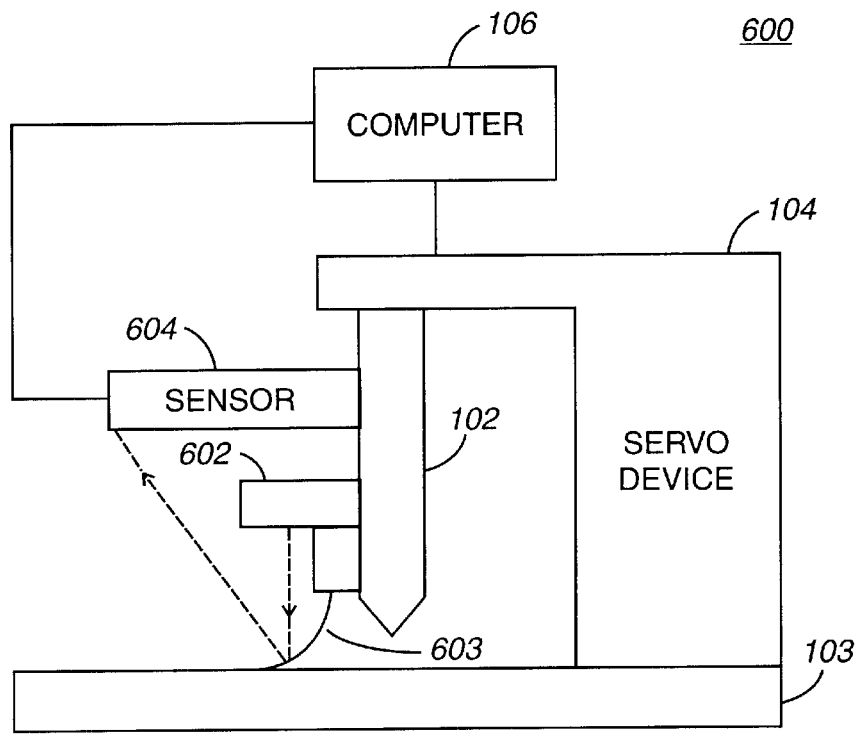
FIG. 6 is an illustration showing the physical architecture of a dispensing system, including a scheme for measuring the distance between the dispenser and the surface using light reflected off of a spring, according to an embodiment of the present invention, showing connectivity among the various components.

FIG. 6 shows a spring 603 attached to dispenser 102. Spring 603 can be a leaf spring or any other spring that may be used for this purpose, known to one of ordinary skill in the art. As shown, spring 603 extends towards surface 103. At rest, or equilibrium, there is no restoring force of spring 603. As spring 603 is placed in contact with surface 103 and spring 603 is moved further towards surface 103, a restoring force is produced within spring 603. That is, as spring 603 is displaced, a restoring force is produced. The contour of spring 603 changes as the restoring force of spring 603 is increased. As shown in FIG. 6, spring 603 bends at a greater angle as the restoring force of spring 603 is increased.

FIG. 6 also shows a light emitter 602 and a sensor 604. Light emitter 602 can be a photodiode, a fiber optic cable, or any other means known to one of ordinary skill in the art for emitting light. Sensor 604 can be a photo-detector, a quad-cell, a bi-cell or any other means known to one of ordinary skill in the art for detecting light.

Light emitter 602 emits light towards spring 603. This light is then reflected by spring 603 and received by sensor 604. As the angle at which spring 603 is bent varies, so does the location in which the reflected light is received by sensor 604. That is, the angle at which spring 603 is bent affects the place in which the light beam strikes sensor 604. Thus, the measurement of the location of the reception of the light on sensor 604 can be used to measure the angle at which spring 603 is bent.

As explained above, the angle at which a leaf spring is bent is associated with the amount of displacement of the spring from equilibrium. As the amount of displacement of a leaf spring increases., so does the angle at which the spring is bent. Thus, a measurement of the angle at which spring 603 is bent can be used to measure the distance between dispenser 102 and surface 103.

Figure 11:
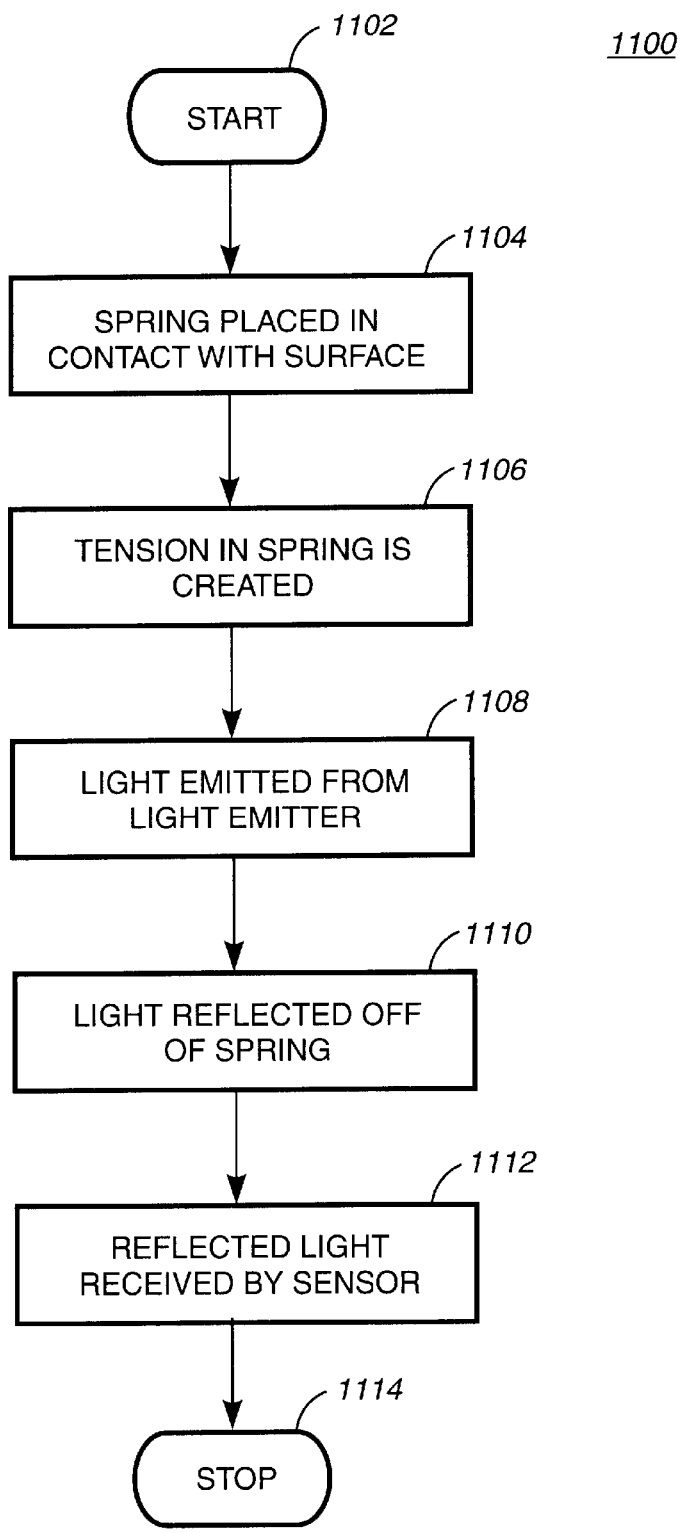
FIG. 11 is a flow chart depicting an embodiment of the operation and control flow of the second light emission and reception process of the present invention.

The operation of FIG. 6 is shown in FIG. 7 above, with additional details regarding the sensor sequence shown in FIG. 11.

FIG. 11 is a flow chart depicting an embodiment of the operation and control flow 1100 of the second light emission and reception process of the present invention. FIG. 11 shows the execution of the sensor sequence of step 704, as it applies to system 600. Control flow begins with step, 1102, with control flowing directly to step 1104.

In step 1104, spring 603 is placed in contact with surface 103.

In step 1106, a restoring force is produced in spring 603 as a result of the contact with surface 103 in step 1104 above.

In step 1108, light is emitted from light emitter 602 towards spring 603.

In step 1110, the emitted light is reflected off of spring 603.

In step 1112, the light reflected off of spring 603 in step 1110 above is received by sensor 604.

In step 1114, control flow 1100 ceases.

The data collected by sensor 604 is subsequently used by computer 106 in step 708 to calculate the actual distance between dispenser 102 and surface 103.

Example Implementations

Figure 12:
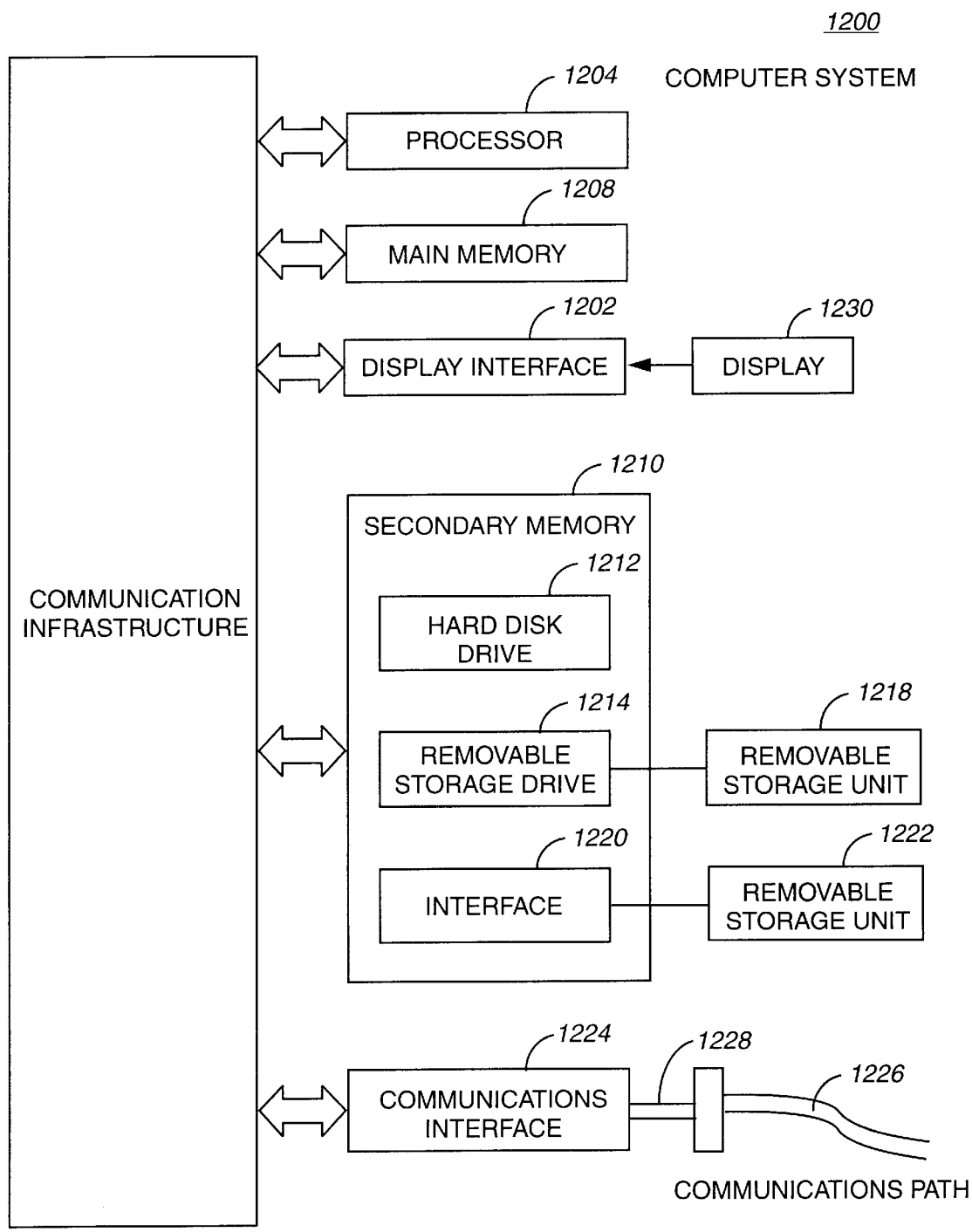
FIG. 12 is a block diagram of an exemplary computer system useful for implementing the present invention.

Computer 106 of the present invention may be implemented using hardware, software or a combination thereof and may be implemented in one or more computer systems or other processing systems. In fact, in one embodiment, computer 106 is directed toward one or more computer systems capable of carrying out the functionality described herein. An example of a computer system 1200 is shown in FIG. 12. The computer system 1200 includes one or more processors, such as processor 1204. The processor 1204 is connected to a communication infrastructure 1206 (e.g., a communications bus, cross-over bar, or network). Various software embodiments are described in terms of this exemplary computer system. After reading this description, it will become apparent to a person skilled in the relevant art(s) how to implement the invention using other computer systems and/or computer architectures.

Computer system 1200 can include a display interface 1202 that forwards graphics, text, and other data from the communication infrastructure 1206 (or from a frame buffer not shown) for display on the display unit 1230.

Computer system 1200 also includes a main memory 1208, preferably random access memory (RAM), and may also include a secondary memory 1210. The secondary memory 1210 may include, for example, a hard disk drive 1212 and/or a removable storage drive 1214, representing a floppy disk drive, a magnetic tape drive, an optical disk drive, etc. The removable storage drive 1214 reads from and/or writes to a removable storage unit 1218 in a well known manner. Removable storage unit 1218, represents a floppy disk, magnetic tape, optical disk, etc. which is read by and written to by removable storage drive 1214. As will be appreciated, the removable storage unit 1218 includes a computer usable storage medium having stored therein computer software and/or data.

In alternative embodiments, secondary memory 1210 may include other similar means for allowing computer programs or other instructions to be loaded into computer system 1200. Such means may include, for example, a removable storage unit 1222 and an interface 1220. Examples of such may include a program cartridge and cartridge interface (such as that found in video game devices), a removable memory chip (such as an EPROM, or PROM) and associated socket, and other removable storage units 1222 and interfaces 1220 which allow software and data to be transferred from the removable storage unit 1222 to computer system 1200.

Computer system 1200 may also include a communications interface 1224. Communications interface 1224 allows software and data to be transferred between computer system 1200 and external devices. Examples of communications interface 1224 may include a modem, a network interface (such as an Ethernet card), a communications port, a PCMCIA slot and card, etc. Software and data transferred via communications interface 1224 are in the form of signals 1228 which may be electronic, electromagnetic, optical or other signals capable of being received by communications interface 1224. These signals 1228 are provided to communications interface 1224 via a communications path (i.e., channel) 1226. This channel 1226 carries signals 1228 and may be implemented using wire or cable, fiber optics, a phone line, a cellular phone link, an RF link and other communications channels.

In this document, the terms "computer program medium" and "computer usable medium" are used to generally refer to media such as removable storage drive 1214, a hard disk installed in hard disk drive 1212, and signals 1228. These computer program products are means for providing software to computer system 1200.

Computer programs (also called computer control logic) are stored in main memory 1208 and/or secondary memory 1210. Computer programs may also be received via communications interface 1224. Such computer programs, when executed, enable the computer system 1200 to perform the features of the present invention as discussed herein. In particular, the computer programs, when executed, enable the processor 1204 to perform the features of the computer system 1200. Accordingly, such computer programs represent controllers of the computer system 1200.

CONCLUSION

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A dispensing system, comprising:

a surface;

a dispenser for dispensing a substance onto the surface;

a first conductive element coupled with the dispenser;

a second conductive element coupled with the Surface, wherein a voltage is applied to the first and the second conductive elements;

a sensor coupled with the first and the second conductive elements for measuring the capacitance between the first and the second conductive elements;

a computer for calculating the distance between the dispenser and the surface using the capacitance; and a servo device for adjusting the location of the dispenser in accordance with the distance calculated by the computer in order to maintain a desired distance between the dispenser and the surface and to maintain a uniform height of the substance that is dispensed onto the surface.

2. The system of claim 1, further comprising:

a mirror coupled with the dispenser;

a light-emitting device coupled with the dispenser, wherein the light-emitting device emits light that is reflected both from the mirror and the surface;

a sensor for receiving the reflected light from both the mirror and the surface;

wherein the computer calculates the distance between the dispenser and the surface using the reflected light.

3. The system of claim 1, further comprising:

a spring coupled with the dispenser, wherein the spring contacts the surface;

a sensor coupled with the spring for measuring a restoring force of the spring;

wherein the computer calculates the distance between the dispenser and the surface using the restoring force.

4. The system of claim 1, further comprising:

a spring coupled with the dispenser, wherein the spring contacts the surface;

a light-emitting device coupled with the dispenser, wherein the light-emitting device emits light that is reflected from the spring;

a sensor for receiving the reflected light from the spring;

wherein the computer calculates the distance between the dispenser and the surface using the reflected light.

5. The system of claim 1, wherein the surface comprises a substrate.

6. The system of claim 5, wherein the distance between the dispenser and the surface is about one hundred microns or less.

7. The system of claim 5, wherein the actual distance maintained between the dispenser and the surface is within about 20% of the desired distance.

8. The system of claim 5, wherein the substance dispensed onto the surface comprises any one of:

epoxy;

epoxy acrylate;

an elastomer; and glue.

9. The system of claim 5, wherein the servo device comprises a robotic arm for adjusting the location of the dispenser in accordance with the distance calculated by the computer in order to maintain the desired distance between the dispenser and the surface.

10. The system of claim 5, wherein the first conductive element comprises any one of:

a thin, conductive, metallic plate coupled with the dispenser; and a thin, conductive, metallic strip coupled with the dispenser.

11. The system of claim 5, wherein the second conductive element comprises any one of:

a thin, conductive, metallic plate coupled with the surface; and a thin, conductive, metallic strip coupled with the surface.

12. The system of claim 5, wherein the sensor is any one of:

a volt meter; and a bridge circuit.

13. A method for dispensing comprising:

measuring a distance between the dispenser and a surface using capacitance;

dispensing a substance onto the surface from a dispenser;

calculating the distance between the dispenser and the surface using a computer; and adjusting a location of the dispenser with a servo in accordance with the distance calculated by the computer in order to maintain a desired distance between the dispenser and the surface and to maintain a uniform height of the substance that is dispensed onto the surface.

14. The method of claim 13, wherein the surface comprises a substrate.

15. The method of claim 14, wherein the distance between the dispenser and the surface is about one hundred microns or less.

16. The method of claim 14, wherein the actual distance maintained between the dispenser and the surface is within about 20% of the desired distance.

17. The method of claim 14, wherein the dispensing a substance onto the surface from a dispenser; includes dispensing a substance onto the surface comprising any one of:

epoxy;

epoxy acrylate;

an elastomer; and glue.

18. The method of claim 14, wherein the adjusting a location of the dispenser with a servo includes a robotic arm for adjusting the location of the dispenser in accordance with the distance calculated by the computer in order to maintain the desired distance between the dispenser and the surface.

* * * * *